Jan. 18, 1966 B. A. DREYFUS 3,230,163
REUSABLE TRANSFER PLATE FOR MAKING PRINTED CIRCUITRY
Filed Aug. 23, 1962
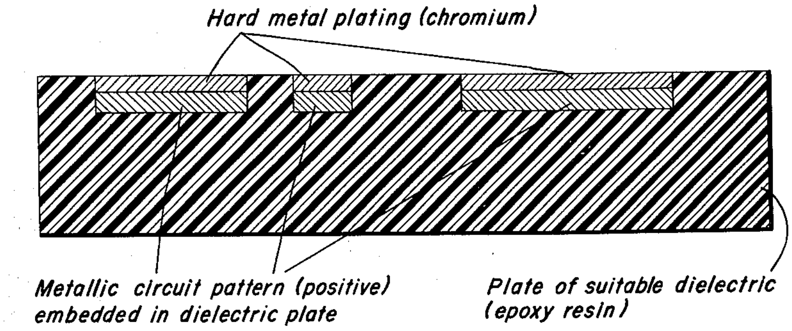
INVENTOR
BERTRAND A. DREYFUS
BY
Kemon, Palmer, Stewart & Estabrook
ATTORNEYS 3,230,163

REUSABLE TRANSFER PLATE FOR MAKING PRINTED CIRCUITRY

Bertrand Alain Dreyfus, Sevres, France, assignor to Societe d'Electronique et d'Automatisme, Courbevoie, Seine, France Filed Aug. 23, 1962, Ser. No. 218,883
Claims priority, application France, Sept. 4, 1961, 872,406, Patent 1,306,698
3 Claims. (Cl. 204—281)

The present invention concerns improvements in or relating to the production of printed circuitry, i.e. of components comprising a conductor pattern bonded on at least a face of an insulating carrier.

It more particularly relates to the so-called transfer process for the production of such printed circuitry. In the transfer plating process, a stainless steel plate or some other type of plate that is conductive, rigid and impervious to a plating bath, is printed with a plating resist or masked off in some way with the reverse or negative of the desired conductive pattern. By electroplating copper or some other metal upon the exposed areas of the plate, a conductor pattern is formed on the surface of the stainless steel plate. Removal of the ink or plating mask leaves the conductor pattern on the stainless steel plate ready for transfer to the insulator. This is most easily done by placing the stainless steel sheet in a laminating press with layers of uncured resin material. Under heat and pressure the laminate is cured and upon removal from the press the stainless steel plate can be stripped from the surface leaving the desired conductor pattern impressed in the surface of the insulator. For some years it has been proposed to so provide the transfer plate as to be re-usable, the reverse mask pattern being required to strongly adhere to the metal of the transfer plate and consequently remain bonded to said plate after the stripping of the plated metal. Since such masks as were proposed were made with enamels or thermosetting resins, no usable transfer plate of this reusable kind presently exists. It is the object of the invention to provide an efficient reusable transfer plate.

According to the invention, a reusable transfer plate or matrix comprises a printed circuit made flush within an insulating backing, said printed circuit being made of copper, or other metal which is easily etchable, the copper being plated by chromium or some other conductor material which, directly or through an intermediate sublayer, strongly adheres to the said printed circuit material but presents a low adherence to any transfer plating which may be made over the transfer plate for the production of the printed circuits.

Such a transfer plate may be made as follows: a laminate comprising a metal layer and a dielectric layer of uncured thermosetting resin (resin in a somewhat plastic state) is etched according to any conventional process to form the positive conductor pattern which is then plated with the hard metal film such as a chromium film; the resulting product is then pressed in a laminating press which on the one hand depresses the composite metal pattern into the dielectric and, on the other hand, simultaneously polymerizes and hardens the resin, hence ensuring an intimate bondage of the embedded circuit pattern within the hardened dielectric with the exposed surface of the hard metal film being flush with the surface of the hardened dielectric backing plate. The resulting composite plate constitutes the transfer plate proper to be used for the repeated production of printed circuitry by successive plating and transfer steps on to and from said composite plate.

Considering a more specific illustrative example, comprising a copper-chromium composite printed circuit pattern in a dielectric backing plate, the laminated member used at the start of the operation comprises a layer of epoxy glass and a layer of copper; the resin of the epoxy is in an uncured and somewhat plastic state, as said. The copper foil is etched as usual, by the steps of impressing the circuit pattern on a photosensitive layer resist coated upon the copper surface, developing the picture, washing the resist to effect removal of the remaining unimpressed portions of the layer and attacking the exposed portions of the copper in an acid bath. The product thus obtained is placed into a chromium plating bath which coats the copper pattern with a layer of hard chromium strongly adhering to the said pattern. After the plating operation is over, the plated member is placed within a heated laminating press or die and is subjected to heat and pressure to embed the circuit within the dielectric layer with the chromium layer flush with respect to the surface of the dielectric whilst polymerizing the resin in said dielectric and consequently completely hardening the transfer plate as a whole.

The thus made transfer plate or matrix may be reused any number of times required for the production of printed circuits, being each time re-plated by electrolytic copper for instance, which does not strongly adhere to the chromium surface of the exposed pattern, and each time having said plated copper pattern removed by stripping from the composite transfer plate and a final insulator backing for the printed circuit. The transfer step may be made in accordance with the known technique, or by polymerizing a layer of resin coating an insulating cured carrier within the lamination heated press. However, the stripping may also be made without any application of the insulator backing to the stripped pattern, provided that the pattern be integral, viz its conductor parts are all mechanically interconnected. When this is not the case in the circuit pattern proper, interconnecting bridges must be provided on the pattern of the transfer plate; said bridges will be reproduced in the stripped pattern and, after application and bondage to a final insulator backing, such superfluous bridges may be removed either by mechanical cutting or by chemical etching, as the case may be.

I claim:

1. A reusable transfer plate for the production of printed circuitry by a known transfer process which comprises a rigid backing plate formed of thermo-setting resin, metallic conductors embedded within said backing plate according to the desired circuit pattern with one surface thereof exposed on a surface of the backing plate and being flush with the surface of the backing plate, the exposed surfaces of said embedded conductors being formed of a metal which is relatively hard with respect to the metal to be deposited thereon and which has low adherence to the metal which is to be electrolytically deposited on said exposed surfaces, said embedded conductors being formed of a surface layer of chromium and a sub-layer of copper.

2. A reusable transfer plate according to claim 1 wherein said backing plate is formed of epoxy resin.

3. A reusable transfer plate according to claim 1 wherein said backing plate is formed of epoxy glass resin.

References Cited by the Examiner

UNITED STATES PATENTS

| | | | |
|---|---|---|---|
| 2,447,541 | 8/1948 | Sabee et al. | 156—150 |
| 2,734,150 | 7/1956 | Beck. | |
| 2,874,085 | 2/1959 | Brietzke | 156—150 |
| 2,984,595 | 5/1961 | Schumpelt et al. | 156—151 |
| 3,024,151 | 3/1962 | Robinson | 156—150 |

ALEXANDER WYMAN, *Primary Examiner.*

JACOB STEINBERG, EARL M. BERGERT, *Examiners.*